(12) United States Patent
Hagimoto et al.

(10) Patent No.: US 11,108,093 B2
(45) Date of Patent: Aug. 31, 2021

(54) ADJUSTING ELECTRIC ENERGY OF PLURALITY OF BATTERIES MOUNTED IN TRAVELING VEHICLE

(71) Applicant: TOYOTA JIDOSHA KABUSHIKI KAISHA, Toyota (JP)

(72) Inventors: Taiga Hagimoto, Mishima (JP); Yasuhiro Oshiumi, Gotemba (JP); Satoru Ito, Numazu (JP); Tatsuya Yoshida, Mishima (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 259 days.

(21) Appl. No.: 16/376,402

(22) Filed: Apr. 5, 2019

(65) Prior Publication Data
US 2019/0319315 A1 Oct. 17, 2019

(30) Foreign Application Priority Data
Apr. 13, 2018 (JP) .............................. JP2018-077525

(51) Int. Cl.
| | |
|---|---|
| *H01M 10/00* | (2006.01) |
| *H01M 10/44* | (2006.01) |
| *H02J 7/00* | (2006.01) |
| *G01R 31/382* | (2019.01) |
| *B60L 58/12* | (2019.01) |

(52) U.S. Cl.
CPC ........... *H01M 10/441* (2013.01); *B60L 58/12* (2019.02); *G01R 31/382* (2019.01); *H02J 7/008* (2013.01); *H02J 7/0063* (2013.01); *H01M 2220/20* (2013.01)

(58) Field of Classification Search
CPC .. H01M 10/441; H01M 2220/20; H02J 7/008; H02J 7/0063; H02J 7/1423; G01R 31/382; B60L 58/12
See application file for complete search history.

(56) References Cited

U.S. PATENT DOCUMENTS

| | | | | |
|---|---|---|---|---|
| 7,933,694 | B2* | 4/2011 | Kato | B60K 6/365 701/22 |
| 8,229,616 | B2* | 7/2012 | Aridome | B60L 50/16 701/22 |
| 8,423,210 | B2* | 4/2013 | Kato | B60W 10/26 701/22 |
| 8,473,136 | B2* | 6/2013 | Kato | B60L 58/20 701/22 |

(Continued)

FOREIGN PATENT DOCUMENTS

JP 2014-023374 A 2/2014

*Primary Examiner* — Naum Levin
(74) *Attorney, Agent, or Firm* — Sughrue Mion, PLLC

(57) ABSTRACT

A power-supply control device includes: a distribution adjustment unit adjusting electric energy; and a loss comparison unit comparing losses in power running and regeneration and determining, with respect to power running and regeneration, whether a loss in a current state is smaller. Further, the distribution adjustment unit adjusts the electric energy by performing the distribution in accordance with the remaining capacity ratio in the current state in a case where it is determined that the loss in power running is smaller when the current state is a power running state or in a case where it is determined that the loss in regeneration is smaller when the current state is a regeneration state.

6 Claims, 10 Drawing Sheets

(56) References Cited

U.S. PATENT DOCUMENTS

| | | | |
|---|---|---|---|
| 8,493,031 B2* | 7/2013 | Murao | H02J 7/0016 |
| | | | 320/132 |
| 8,718,847 B2* | 5/2014 | Itagaki | B60W 20/40 |
| | | | 701/22 |
| 8,751,081 B2* | 6/2014 | Kato | B60W 10/26 |
| | | | 701/22 |
| 9,106,104 B2* | 8/2015 | Kinjo | H02J 3/32 |
| 9,825,474 B2* | 11/2017 | Tohara | H02J 7/0021 |
| 9,941,694 B2* | 4/2018 | Tomura | H02M 3/158 |
| 10,491,122 B2* | 11/2019 | Goto | H02M 3/158 |
| 10,658,849 B2* | 5/2020 | Syouda | H01M 10/482 |

* cited by examiner

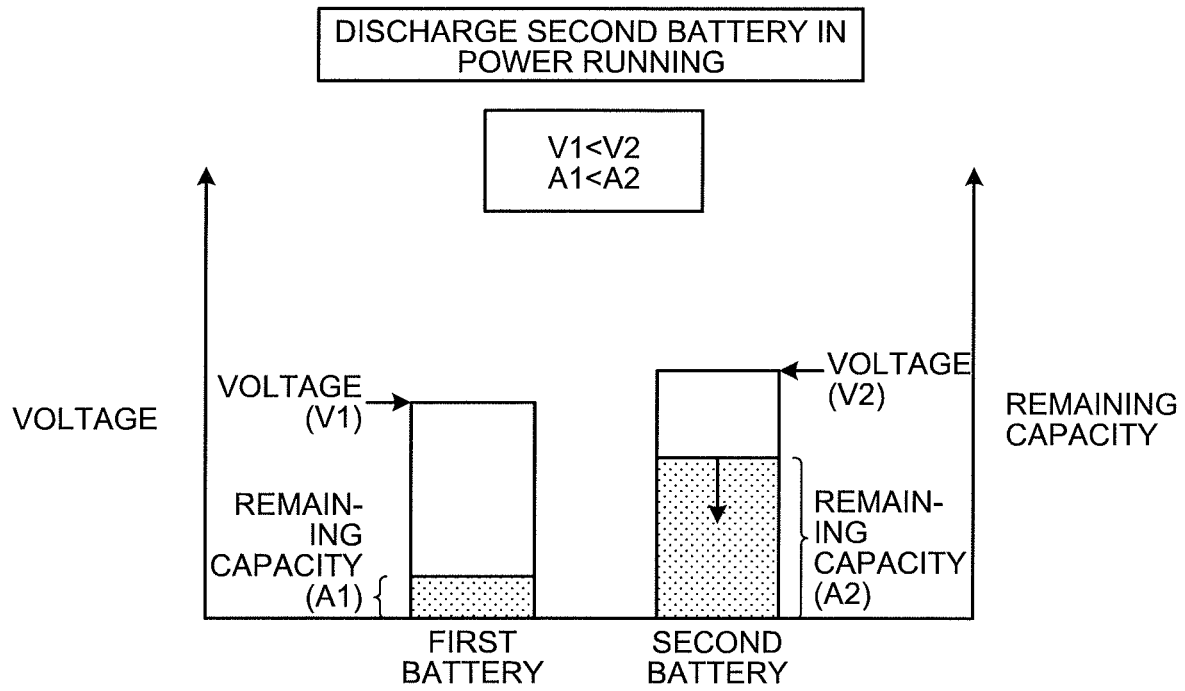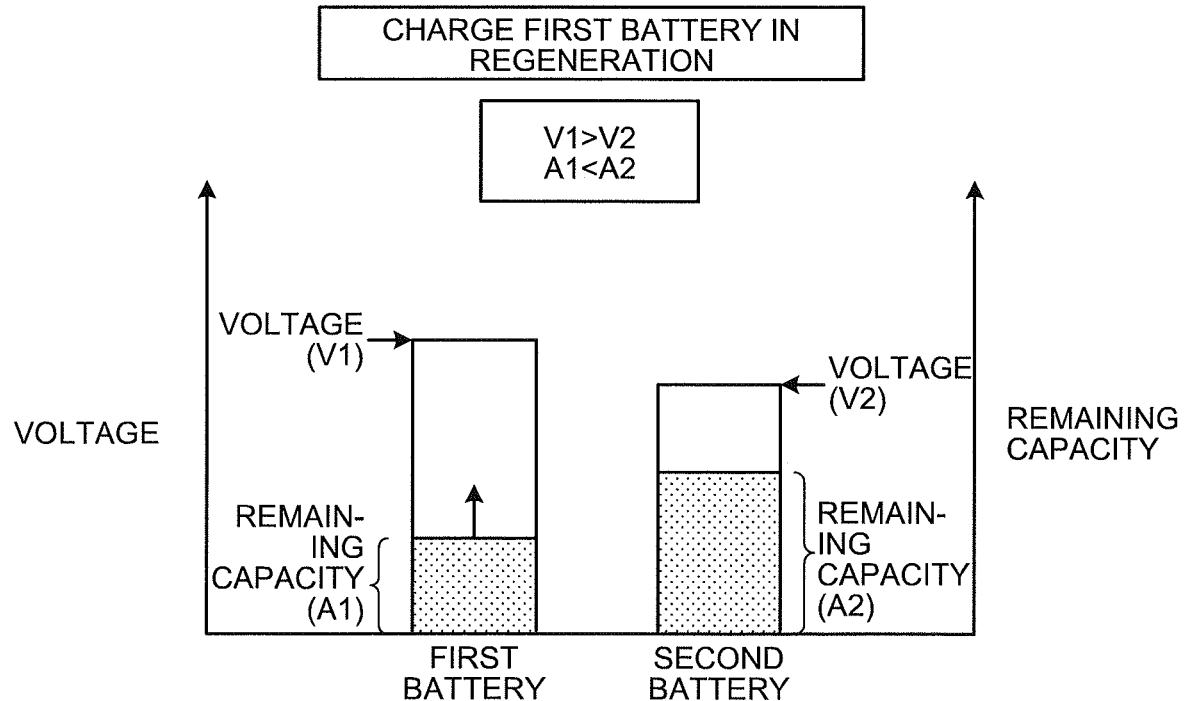

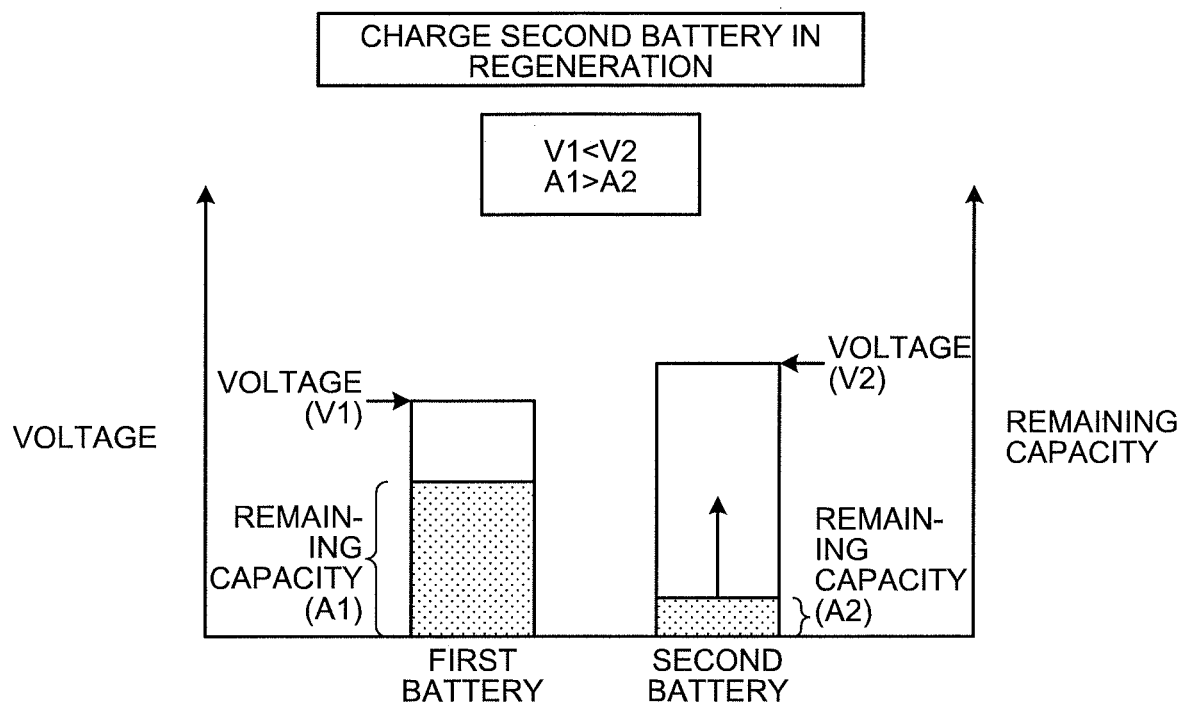

ADJUSTING ELECTRIC ENERGY OF PLURALITY OF BATTERIES MOUNTED IN TRAVELING VEHICLE

CROSS-REFERENCE TO RELATED APPLICATION(S)

The present application claims priority to and incorporates by reference the entire contents of Japanese Patent Application No. 2018-077525 filed in Japan on Apr. 13, 2018.

BACKGROUND

The present disclosure relates to a power-supply control device.

Japanese Laid-open Patent Publication No. 2014-023374 discloses that input/output electric power is distributed to two electric storage devices in such a manner that a total loss of an internal resistance loss of a first electric storage device and an internal resistance loss of a second electric storage device is decreased in a power-supply control device that controls input/output electric power of a plurality of electric storage devices.

SUMMARY

There is a need for providing a power-supply control device that can reduce a loss in whole traveling when adjusting electric energy of a plurality of electric storage devices mounted in a vehicle.

According to an embodiment, a power-supply control device, that is mounted in a vehicle including a plurality of electric storage devices and that controls charging/discharging with respect to the plurality of electric storage devices, includes: a distribution adjustment unit adjusting electric energy in a manner that a difference between a remaining capacity of a first electric storage device and a remaining capacity of a second electric storage device becomes small when each of the electric storage devices is charged/discharged and distributing input/output electric power to the first electric storage device and the second electric storage device on a basis of a remaining capacity ratio between the remaining capacity of the first electric storage device and the remaining capacity of the second electric storage device when adjusting the electric energy; and a loss comparison unit comparing a loss in power running with a loss in regeneration in a case where an amount for the adjustment of the electric energy becomes the same between in power running and in regeneration and determining, with respect to power running and regeneration, whether a loss in a current state is smaller. Further, the distribution adjustment unit adjusts the electric energy by performing the distribution in accordance with the remaining capacity ratio in the current state in a case where it is determined that the loss in power running is smaller when the current state is a power running state or in a case where it is determined that the loss in regeneration is smaller when the current state is a regeneration state.

BRIEF DESCRIPTION OF THE DRAWINGS

FIG. 9 is a graph illustrating a case where power is discharged from a second battery in power running;

FIG. 10 is a graph illustrating a case where power is charged to the first battery in regeneration;

FIG. 11 is a graph illustrating a case where power is charged to the second battery in regeneration;

DETAILED DESCRIPTION

In a case where a distribution is performed in consideration of remaining capacity of each of the electric storage devices, a magnitude of the generated loss differs between power running and during regeneration even when an amount to be adjusted of an electric power amount (electric power adjustment amount) by distribution is the same. Thus, in a configuration in which a plurality of electric storage devices is switched between a power running state and a regeneration state, for example, in a case of being mounted in a vehicle, it is important for reducing a loss in whole traveling whether the distribution for an electric energy adjustment is to be performed in the power running state or the distribution for an electric energy adjustment is to be performed in the regeneration state. In a configuration described in Japanese Laid-open Patent Publication No. 2014-023374, the distribution is performed in consideration of a plurality of losses. However, the losses are based on the losses which are generated in a current state, and the time for power running and the time for regeneration are not considered. Thus, there is a possibility that a loss in the whole traveling does not become minimum.

In the following, a power-supply control device according to an embodiment of the present disclosure will be described in detail with reference to the accompanying drawings. Note that the present disclosure is not limited to the embodiments described below.

Figure 1:
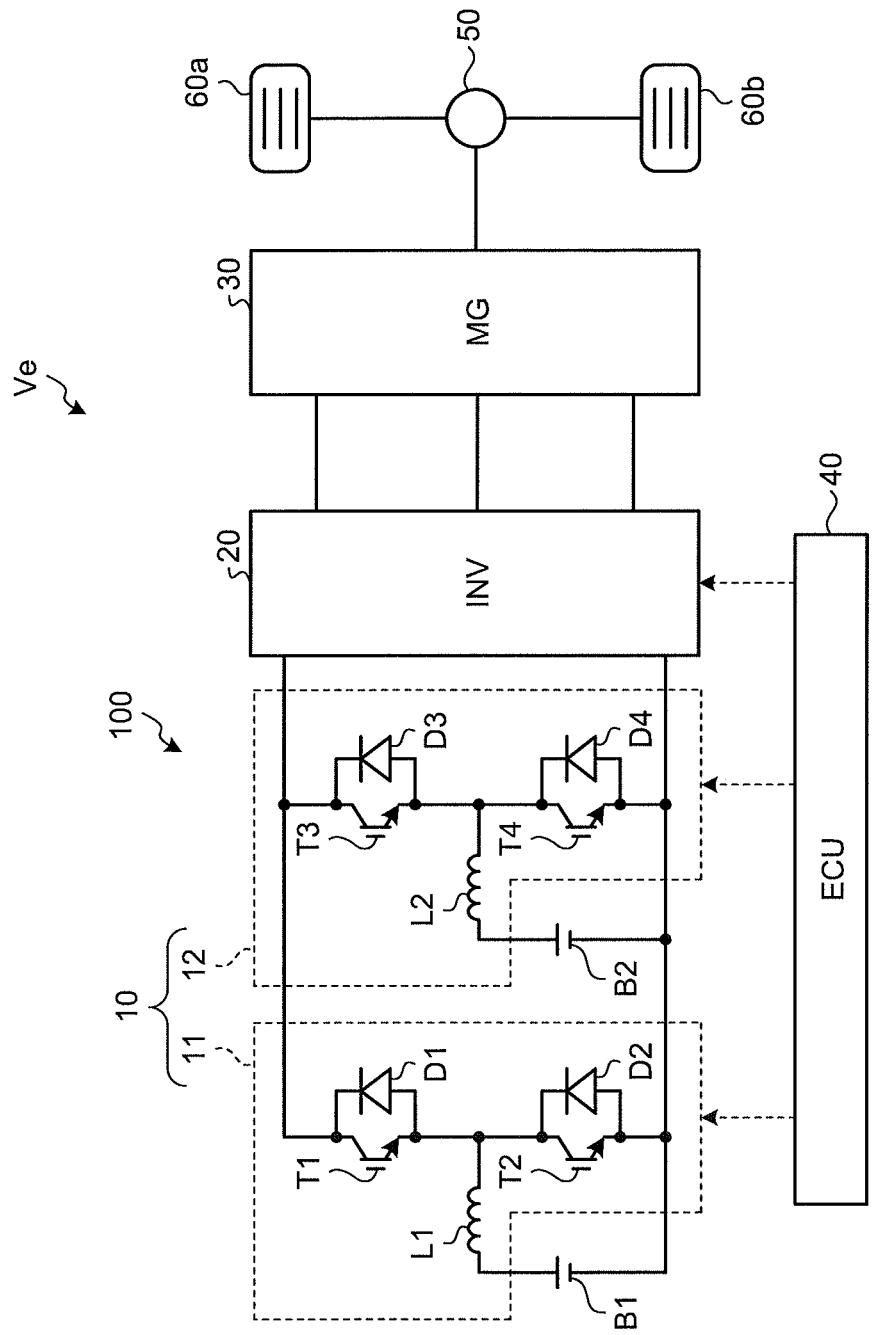
FIG. 1 is a diagram schematically illustrating a vehicle including a power system according to an embodiment.

FIG. 1 is a diagram schematically illustrating a vehicle in which a power system according to an embodiment is mounted. A power system 100 includes a first battery B1, a second battery B2, an electric power adjustment unit 10, an inverter (INV) 20, a motor generator (MG) 30, and an Electronic Control Unit (hereinafter, referred to as "ECU") 40. A vehicle Ve in which the power system 100 is mounted is an electric car in which power output from a motor generator 30 is transmitted to left and right driving wheels 60a and 60b through a differential device 50. Further, a power-supply control device according to an embodiment includes the ECU 40.

Each of the first battery B1 and the second battery B2 is a DC power supply that can be charged/discharged and includes, for example, a secondary battery, which is a nickel-metal hydride battery, a lithium ion battery or the like. The power system 100 includes an electric circuit in which the first battery B1 and the second battery B2 are connected in parallel. In power running, electric power charged in the first battery B1 and the second battery B2 is supplied to the motor generator 30 which serves as a load. In regeneration, since the motor generator 30 functions as a generator, electric power generated by the motor generator 30 is charged into the first battery B1 and the second battery B2. Further, the first battery B1 and the second battery B2 are different kinds of secondary batteries. The first battery B1 corresponds to a first electric storage device according to the present disclosure. The second battery B2 corresponds to a second electric storage device according to the present disclosure.

The electric power adjustment unit 10 includes a first boost converter 11 and a second boost converter 12. The first boost converter 11 includes two transistors T1 and T2, two diodes D1 and D2, and a reactor L1. The second boost converter 12 includes two transistors T3 and T4, two diodes D3 and D4, and a reactor L2. In the electric circuit of the power system 100, the first boost converter 11 is disposed between the first battery B1 and the inverter 20, and the second boost converter 12 is disposed between the second battery B2 and the inverter 20. The electric power adjustment unit 10 adjusts input/output electric power of the first battery B1 and the second battery B2 by performing on/off control (switching control) on a plurality of switching elements including the transistors T1, T2, T3, and T4 by the ECU 40.

The inverter 20 is provided between the batteries B1 and B2 and the motor generator 30. The inverter 20 includes an electric circuit (inverter circuit) including a plurality of switching elements in such a manner that three-phase current can be applied to a coil. The inverter 20 can flow currents of respective phases through coils connected to the inverter circuit.

The motor generator 30 is electrically connected to the inverter 20, and can function as an electric motor and a generator. The motor generator 30 has a motor function driven by electric power supplied from each of the batteries B1 and B2, and a generator function to generate electric power by driving by an external force. When the ECU 40 performs switching control on the plurality of switching elements of the inverter 20, the motor generator 30 is rotationally driven. In the power running state, the vehicle Ve travels by power output from the motor generator 30 that is a power source for traveling. In the regeneration state, the motor generator 30 is driven by an external force input from the left and right driving wheels 60a and 60b and electric power is generated by the motor generator 30. The electric power generated by the motor generator 30 is charged into the first battery B1 and the second battery B2.

The ECU 40 is a control device to control the power system 100 and control charging/discharging of the first battery B1 and the second battery B2. The ECU 40 includes a Central Processing Unit (CPU), a storage unit that stores data such as various kinds of programs, and an arithmetic processing unit that performs various kinds of arithmetic operations. As a result of the arithmetic operations, the ECU 40 outputs a command signal to the electric power adjustment unit 10 or the inverter 20. The power system 100 has a circuit configuration in which electric power of the plurality of batteries B1 and B2 can be independently output. The electric power adjustment unit 10 is controlled by the ECU 40, whereby input/output electric power of the first battery B1 and input/output electric power of the second battery B2 can be respectively controlled. Further, the power system 100 may include, as various kinds of sensors (not illustrated), a first voltage sensor to detect voltage of the first battery B1, a second voltage sensor to detect voltage of the second battery B2, a first current sensor to detect current output from the first battery B1, and a second current sensor to detect current output from the second battery B2. Signals (signal related to measured value) from these various kinds of sensors are input into the ECU 40. The ECU 40 can calculate remaining capacity of the first battery B1 and remaining capacity of the second battery B2 on the basis of the signals input from the voltage sensors and the current sensors.

When the first battery B1 and the second battery B2 are charged/discharged, the ECU 40 performs control to adjust electric energy in such a manner that a difference between the remaining capacity of the first battery B1 and the remaining capacity of the second battery B2 (electric energy difference) becomes smaller. (electric energy adjustment control). Also, when adjusting electric energy, the ECU 40 distributes input/output electric power to the first battery B1 and the second battery B2 on the basis of a ratio of remaining capacity between the remaining capacity of the first battery B1 and the remaining capacity of the second battery B2. Moreover, when distributing input/output electric power to the first battery B1 and the second battery B2, the ECU 40 compares a loss generated in electric energy adjustment in power running and a loss generated in electric energy adjustment in regeneration, and adjusts electric energy in a state where the loss is smaller. This is because magnitude of a generated loss varies between in power running and in regeneration even in a case where the electric power adjustment amounts are the same. As described above, when performing a distribution based on the ratio of remaining capacity for electric energy adjustment, the ECU 40 compares the loss in electric energy adjustment in power running and that in electric energy adjustment in regeneration, and performs the distribution based on the ratio of remaining capacity of the current state in a case where the loss in the current state is smaller. As an example, FIG. 2 illustrates a case where electric energy adjustment is performed in a case where a loss in power running is smaller when a current state is a power running state.

Figure 2:
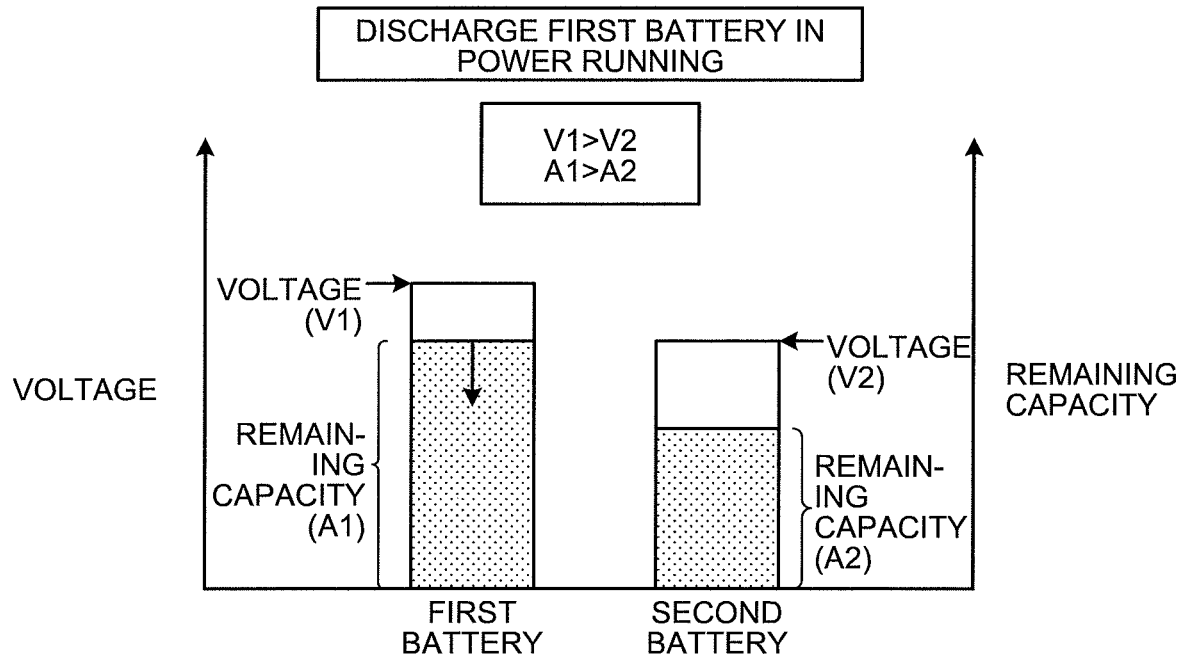
FIG. 2 is a graph for describing a case where power is discharged from a first battery in power running.

FIG. 2 is a graph for describing a case where power is discharged from the first battery B1 in power running. The example of FIG. 2 is a case where the voltage V1 of the first battery B1 is higher than the voltage V2 of the second battery B2 and a case where remaining capacity A1 of the first battery B1 is greater than remaining capacity A2 of the second battery B2. In this case (V1>V2 and A1>A2), in order to reduce a difference between the remaining capacity A1 and the remaining capacity A2, the remaining capacity A1 of the first battery B1 is reduced more in power running or the remaining capacity A2 of the second battery B2 is increased more in regeneration. That is, as timing to adjust electric energy, a time in power running or a time in regeneration can be selected. Moreover, when electric energy is adjusted, input/output electric power corresponding to a ratio of remaining capacity $\alpha$ is distributed to the first battery B1 and the second battery B2. The ratio of remaining capacity $\alpha$ indicates the remaining capacity A1 of the first battery B1 to the sum of the remaining capacity A1 of the first battery B1 and the remaining capacity A2 of the second battery B2. The ratio of remaining capacity α becomes a predetermined value within a range of 0 to 1 (0≤α≤1). Then, the ECU 40 adjusts electric energy by using the ratio of remaining capacity α and a distribution ratio β.

Figure 3:
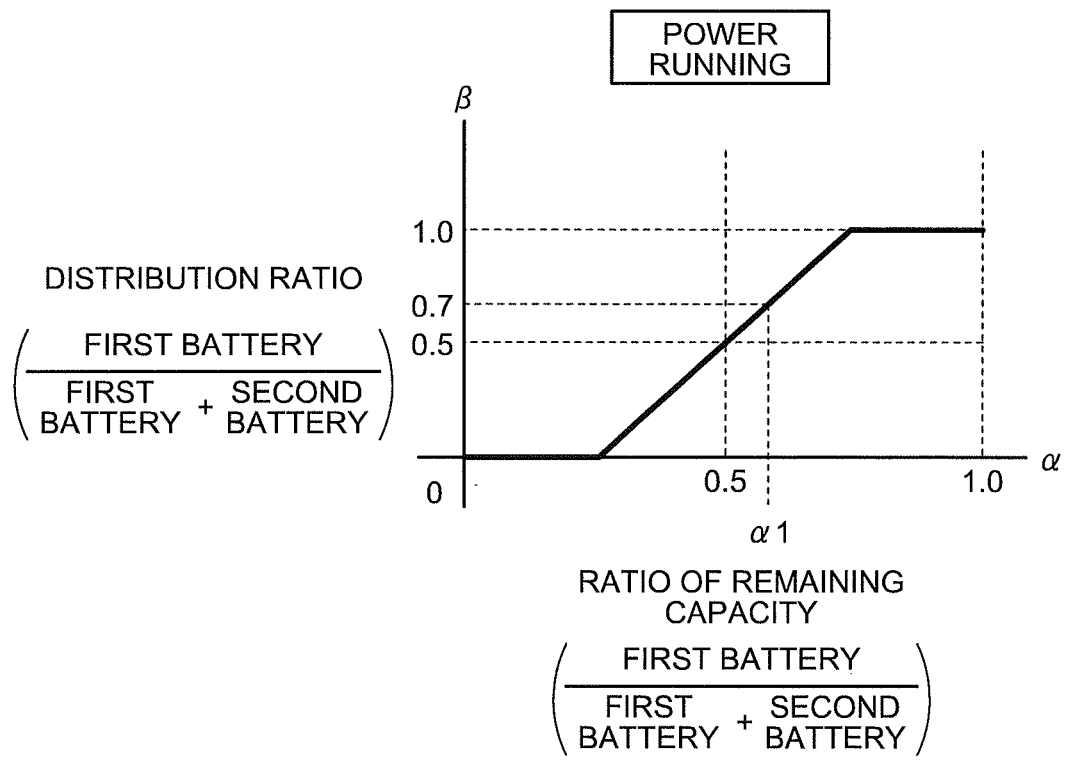
FIG. 3 is a graph illustrating a relationship between a ratio of remaining capacity and a distribution ratio in power running.

FIG. 3 is a graph illustrating a relationship between a ratio of remaining capacity α and a distribution ratio β in power running. The distribution ratio β indicates input/output electric power of the first battery B1 to the sum of the input/output electric power of the first battery B1 and input/output electric power of the second battery. The distribution ratio β becomes a predetermined value within a range of 0 to 1 (0≤β≤1). The ECU 40 determines the distribution ratio β on the basis of the ratio of remaining capacity α in a manner of the relationship illustrated in FIG. 3. Then, the ECU 40 distributes, with respect to requested electric power requested to the power system 100, input/output electric power corresponding to the distribution ratio β to the first battery B1 and the second battery B2. Since an example illustrated in FIG. 3 indicates the time of power running, the distribution ratio β of FIG. 3 is a distribution ratio in power running and indicates output electric power (discharged amount) of the first battery B1 to the sum of the output electric power (discharged amount) of the first battery B1 and output electric power (discharged amount) of the second battery B2. In power running, the distribution ratio β changes in a manner of becoming large as the ratio of remaining capacity α is increased toward 1.0. Further, the distribution ratio β becomes 0.5 when the ratio of remaining capacity α is 0.5. When the ratio of remaining capacity α is greater than 0.5, it is indicated that the remaining capacity A1 of the first battery B1 is large. Thus, the distribution ratio β becomes a value greater than 0.5 in such a manner that a reduction amount of the remaining capacity A1 by power running becomes greater. Moreover, in power running, the distribution ratio β becomes 0 in a case where the ratio of remaining capacity α is a value close to 0 (within predetermined range). In contrast, the distribution ratio β becomes 1.0 in a case where the ratio of remaining capacity α is a value close to 1 (within predetermined range). In power running, the distribution ratio β corresponding to the ratio of remaining capacity α is determined on the basis of the relationship of FIG. 3. For example, when the ratio of remaining capacity α in the example of FIG. 2 (V1>V2 and A1>A2) is α1, the ratio of remaining capacity α1 becomes a value greater than 0.5 and a distribution ratio β in power running which ratio corresponds to this ratio of remaining capacity α1 is set to 0.7 (see FIG. 3). On the other hand, in regeneration, a relationship with a distribution ratio β is reversed from that in power running.

Figure 4:
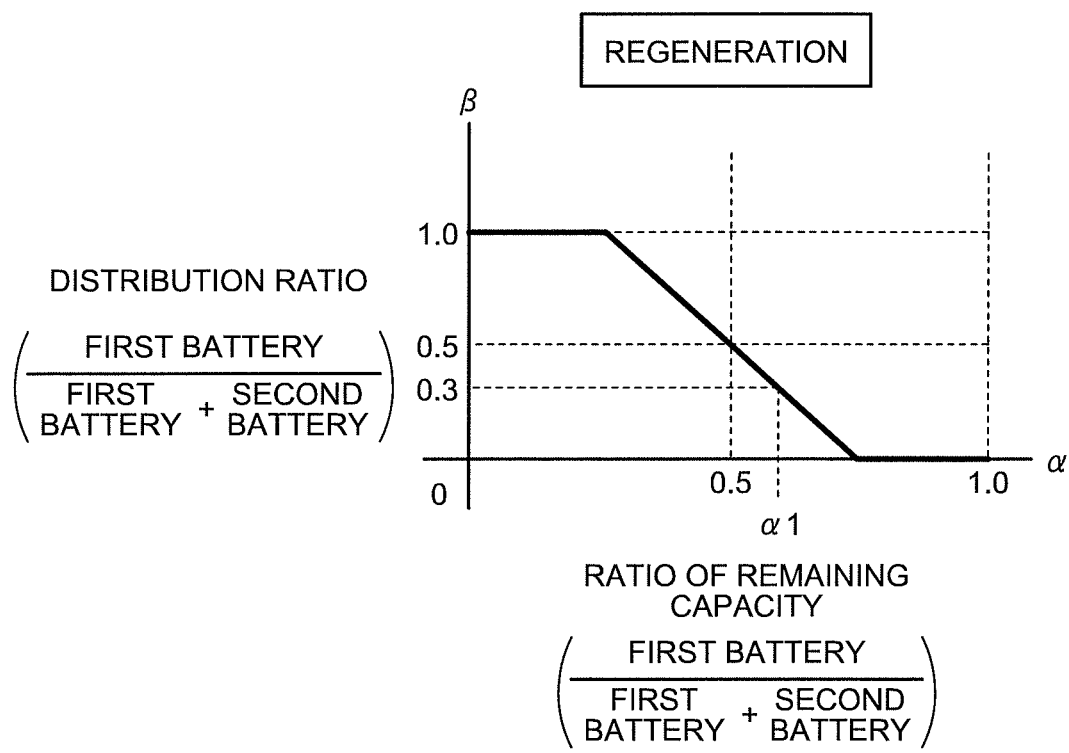
FIG. 4 is a graph illustrating a relationship between the ratio of remaining capacity and the distribution ratio in regeneration.

FIG. 4 is a graph illustrating a relationship between a ratio of remaining capacity α and a distribution ratio β in regeneration. Since an example of FIG. 4 indicates time of regeneration, the distribution ratio β of FIG. 4 is a distribution ratio in regeneration and indicates input power (charged amount) of the first battery B1 to the sum of the input electric power (charged amount) of the first battery B1 and input power (charged amount) of the second battery B2. In regeneration, the distribution ratio β changes in a manner of becoming small as the ratio of remaining capacity α is increased toward 1.0. Further, when the ratio of remaining capacity α is 0.5, the distribution ratio β in regeneration becomes 0.5. When the ratio of remaining capacity α is greater than 0.5, it is indicated that the remaining capacity A1 of the first battery B1 is large. Thus, the distribution ratio β in regeneration becomes a value smaller than 0.5 in such a manner that the remaining capacity A1 is not increased much by regeneration. Moreover, in regeneration, the distribution ratio β becomes 1.0 in a case where the ratio of remaining capacity α is a value close to 0 (within predetermined range). In contrast, the distribution ratio β becomes 0 in a case where the ratio of remaining capacity α is a value close to 1 (within predetermined range). In regeneration, the distribution ratio β corresponding to the ratio of remaining capacity α is determined on the basis of the relationship illustrated in FIG. 4. For example, with respect to the ratio of remaining capacity α1 in the above-described example illustrated in FIG. 2 (V1>V2 and A1>A2), the distribution ratio β in regeneration which ratio corresponds to the ratio of remaining capacity α1 becomes 0.3 (see FIG. 4). As illustrated in FIG. 3 and FIG. 4, a relationship between a ratio of remaining capacity α and a distribution ratio β becomes symmetrical between power running and regeneration.

Then, when distributing input/output electric power by using a relationship between the ratio of remaining capacity α and the distribution ratio β, the ECU 40 compares a loss generated in an electric energy adjustment in power running and a loss generated in an electric energy adjustment in regeneration, and performs distribution in one state where the is relatively small.

Figure 5:
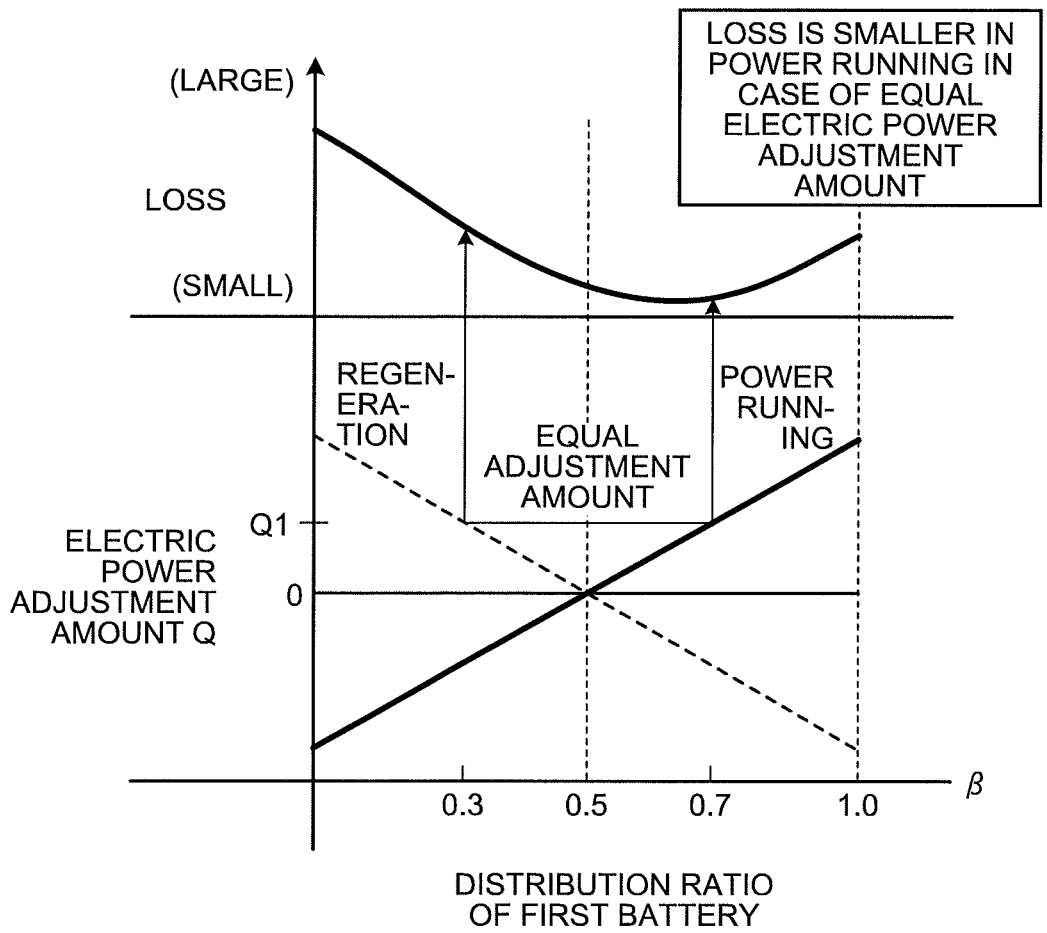
FIG. 5 is a graph illustrating a relationship between an electric power adjustment amount and a loss.

FIG. 5 is a graph illustrating a relationship between the electric power adjustment amount and the loss. An electric power adjustment amount Q is an amount to reduce a difference between the remaining capacity A1 of the first battery B1 and the remaining capacity A2 of the second battery B2. This electric power adjustment amount Q corresponds to a distribution ratio β in each of power running and regeneration. Then, there is a case where the electric power adjustment amount Q becomes the same value (equal electric power adjustment amount) between in power running and in regeneration. For example, the electric power adjustment amount Q becomes the same (electric power adjustment amount Q1) in a case where a distribution ratio β of the first battery B1 is 0.7 in power running and a case where the distribution ratio β of the first battery B1 is 0.3 in regeneration. Even in a case of an equal adjustment amount such as this electric power adjustment amount Q1, a loss generated in power running and a loss generated in regeneration become different in magnitude. As illustrated in FIG. 5, a loss in a case of the electric power adjustment amount Q1 of when the distribution ratio β in power running is 0.7 is smaller than a loss in a case of the electric power adjustment amount Q1 of when the distribution ratio β in regeneration is 0.3. In an example illustrated in FIG. 5, in a case of the equal electric power adjustment amount, a loss becomes smaller when electric energy is adjusted in power running. Then, since a power running state and a regeneration state are repeated in utilization of the power system 100 in normal traveling by the vehicle Ve, it becomes possible to reduce a loss in whole traveling by performing electric energy adjustment in one of power running and regeneration which one has a smaller loss.

Also, a graph of a loss illustrated in FIG. 5 indicates a loss generated in the above-described relationship illustrated in FIG. 2 (V1>V2 and A1>A2). A loss of a battery is expressed by the product of a square of current and internal resistance. In a case where the internal resistance of a battery is constant, a loss becomes smaller when a current value is smaller. Then, since electric power is expressed by the product of a current value and a voltage value, the voltage value and the current value are inversely proportional to each other in a case where the electric power is constant.

From these relationships, a loss becomes smaller when a voltage value is greater in a case where internal resistance of a battery is constant. In the relationship illustrated in FIG. 2, a loss becomes smaller when electric energy is adjusted with the first battery B1 as an object since the voltage V1 of the first battery B1 is higher than the voltage V2 of the second battery B2. Moreover, since the first battery B1 has greater remaining capacity than the second battery B2, a loss is smaller when the remaining capacity A1 is reduced in power running. Thus, in the graph of a loss illustrated in FIG. 5, the smallest value (minimum value) of the loss is on a side where the distribution ratio β in power running is greater than 0.5.

Figure 6:
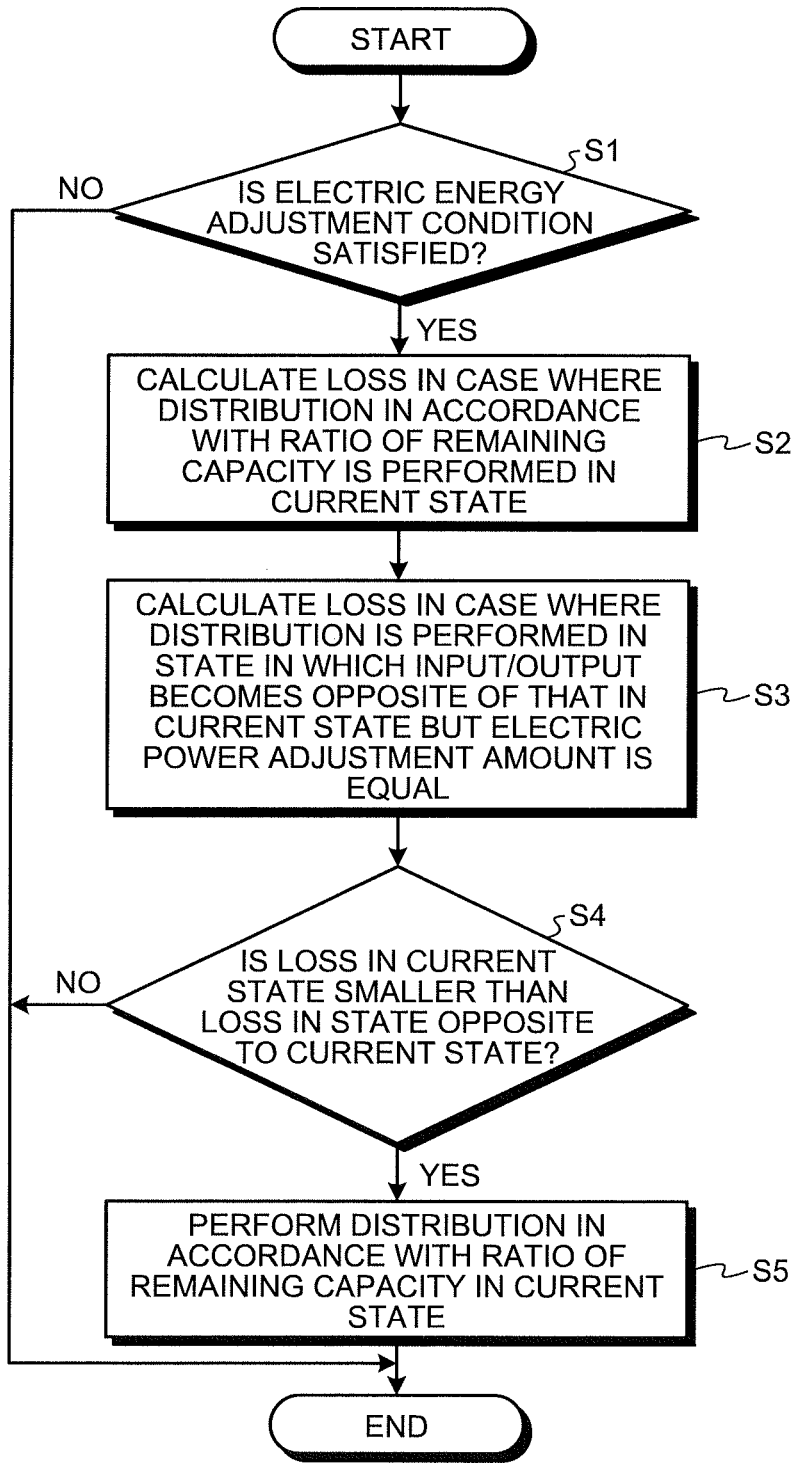
FIG. 6 is a flowchart illustrating a control flow of electric energy adjustment.

FIG. 6 is a flowchart illustrating a control flow of electric energy adjustment. The control illustrated in FIG. 6 is performed by the ECU 40.

The ECU 40 determines whether an electric energy adjustment condition is satisfied (Step S1). In Step S1, it is determined whether a difference between remaining capacity A1 of the first battery B1 and remaining capacity A2 of the second battery B2 is equal to or greater than a predetermined value. In a case where the difference between the remaining capacity A1 and the remaining capacity A2 is equal to or greater than the predetermined value, it is determined that the electric energy adjustment condition is satisfied. Alternatively, it is determined in Step S1 whether requested electric power (output request) to the power system 100 is equal to or higher than a predetermined value. In a case where the requested electric power is equal to or higher than the predetermined value, it is determined that the electric energy adjustment condition is satisfied. The ECU 40 can calculate the requested electric power on the basis of an accelerator position and vehicle speed. Then, in a case where the electric energy adjustment condition is not satisfied and negative determination is made in Step S1 (NO in Step S1), the control routine ends.

In a case where the electric energy adjustment condition is satisfied and positive determination is made in Step S1 (YES in Step S1), the ECU 40 calculates the loss generated when distribution according to the ratio of remaining capacity α is performed in a current state (Step S2). In Step S2, the loss is calculated by utilization of a distribution ratio β determined according to the ratio of remaining capacity α. Further, the current state indicates which of a power running state and a regeneration state is a current state. In a case where the current state is the power running state, the loss in power running which loss is generated when electric energy adjustment is performed is calculated by utilization of the distribution ratio β in power running in Step S2. On the other hand, in a case where the current state is the regeneration state, the loss in regeneration which loss is generated when electric energy adjustment is performed is calculated by utilization of the distribution ratio β in regeneration in Step S2. Then, the loss calculated in Step S2 is a total loss in an electric system. The total loss in the electric system is the loss generated in the whole power system 100 and is the sum of the loss in the first battery B1, the loss in the second battery B2, the loss in the first boost converter 11, the loss in the second boost converter 12, the loss in the inverter 20, and the loss in the motor generator 30. A processing unit in Step S2 is a unit to estimate an electric power loss generated when distribution is performed in the current state.

The ECU 40 calculates a loss generated when distribution is performed in a state which is opposite to the current input/output state but an electric power adjustment amount is the same (Step S3). In Step S3, a loss generated when distribution is performed for an adjustment of electric energy equal to that in Step S2 is calculated with respect to the state opposite to the current state in Step S2, that is, a state in which an absolute value of electric power is the same but a positive/negative sign thereof is opposite and in which power running becomes regeneration and vice versa. Output (discharging) by power running is indicated in a case where a sign of electric power is positive, and input (charging) by regeneration is indicated in a case where a sign of electric power is negative. A processing unit in Step S3 is a unit to estimate a loss generated when the distribution is performed in the state opposite to the current state.

Figure 7:
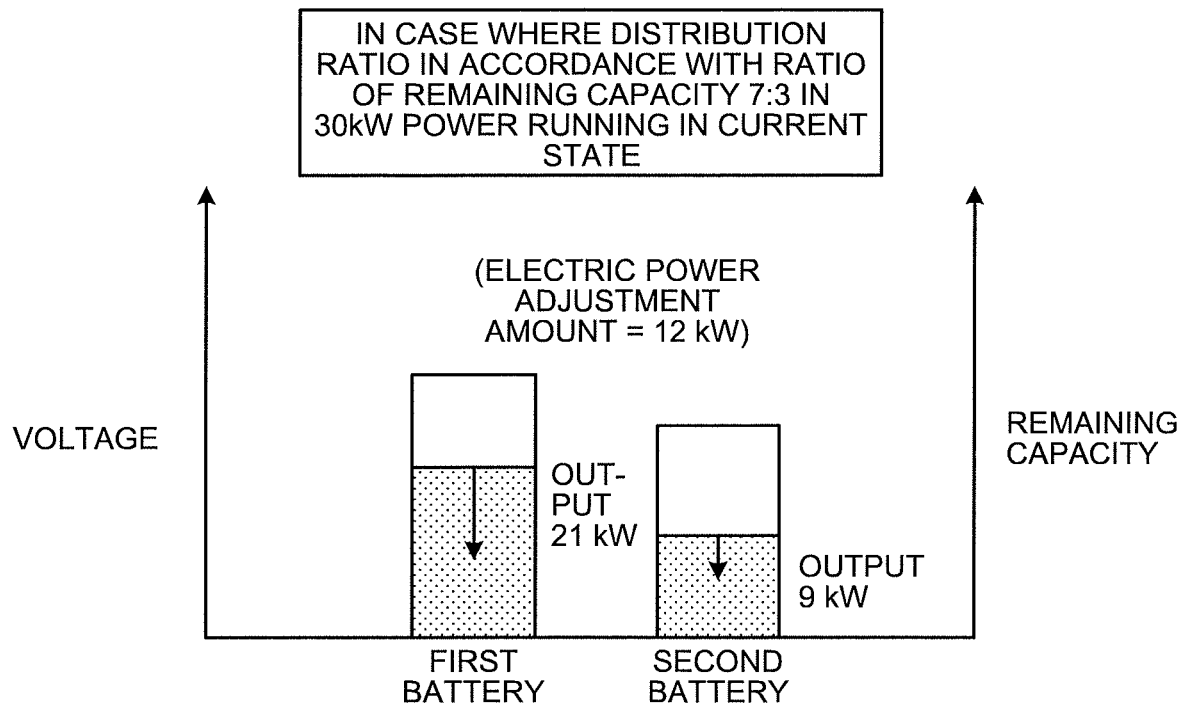
FIG. 7 is a graph illustrating an example where a loss in power running is calculated when a current state is a power running state.
Figure 8:
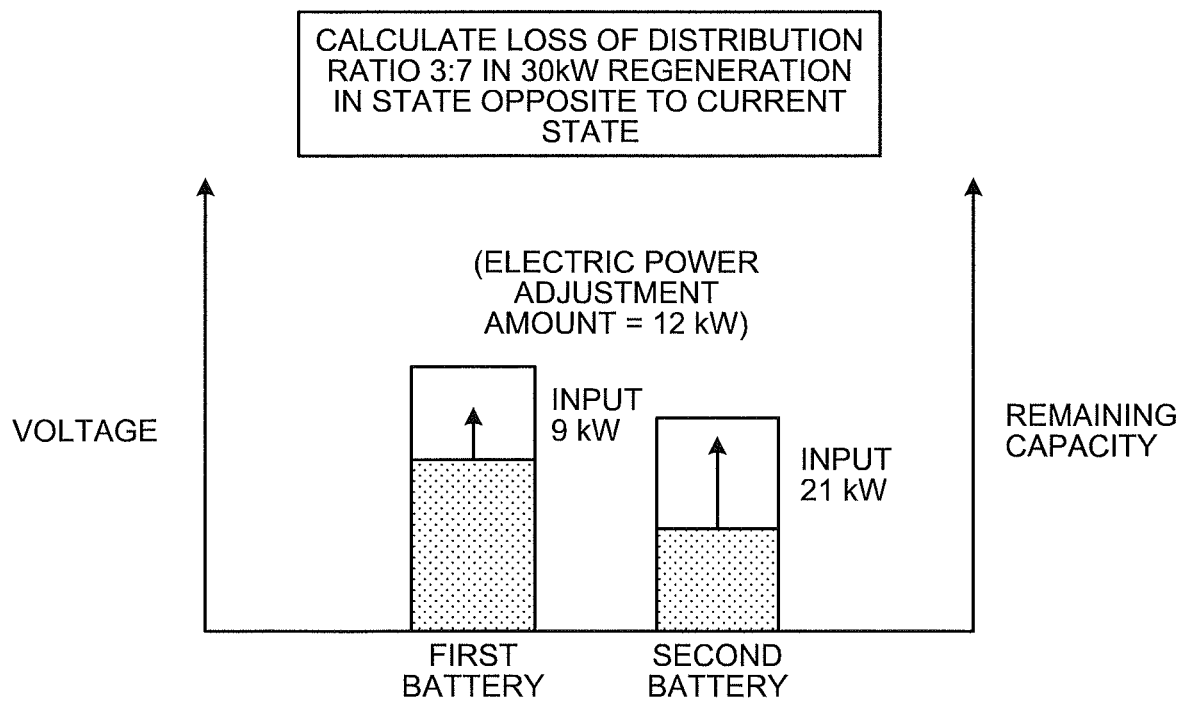
FIG. 8 is a graph illustrating an example where a loss in regeneration is calculated when a state opposite to the current state is a regeneration state.

Here, a process in Step S2 and Step S3 in which the process is performed when the current state is the power running state will be described with reference to FIG. 7 and FIG. 8. As illustrated in FIG. 7, when an output request (requested electric power) in power running is 30 kW, the first battery B1 outputs 21 kW and the second battery B2 outputs 9 kW in a case where a distribution ratio β according to a ratio of remaining capacity α becomes 7:3. The electric power adjustment amount in this power running becomes 12 kW. In Step S2, a loss in the current state (loss in power running) is calculated with respect to the relationship of FIG. 7. As illustrated in FIG. 8, a state opposite to the relationship of FIG. 7 is a case where an input request (requested electric power) in regeneration is 30 kW, a distribution ratio β in regeneration is 3:7, and an electric power adjustment amount becomes 12 kW that is the same with that in power running. In this regeneration, the first battery B1 inputs 9 kW and the second battery B2 inputs 21 kW. In Step S3, a loss in an opposite state of the current state (loss in regeneration) is calculated with respect to a relationship illustrated in FIG. 8.

Refer to FIG. 6, again. When calculating a loss in the current state and that in the opposite state, the ECU 40 determines whether the loss in the current state is smaller than the loss in the opposite state of the current state (Step S4). In Step S4, the loss calculated in Step S2 and the loss calculated in Step S3 are compared and it is determined which of the losses is smaller. For example, in a case where the current state in Step S2 is the power running state, it is determined in Step S4 whether a loss estimated to be generated when distribution is performed in the power running state is smaller than a loss estimated to be generated when distribution is performed in the subsequent regeneration state. Alternatively, in a case where the current state is the regeneration state in Step S2, it is determined in Step S4 whether a loss estimated to be generated when distribution is performed in the regeneration state is smaller than a loss estimated to be generated when distribution is performed in the subsequent power running state.

In a case where positive determination is made in Step S4 (YES in Step S4), the ECU 40 performs the distribution according to the ratio of remaining capacity α in the current state (Step S5). In Step S5, in a case where the current state is the power running state, electric energy is adjusted by the distribution of the output electric power corresponding to the distribution ratio β in power running to the first battery B1 and the second battery B2. Alternatively, in Step S5, in a case where the current state is the regeneration state, electric energy is adjusted by the distribution of the input electric power corresponding to the distribution ratio β in regeneration to the first battery B1 and the second battery B2. In this Step S5, input/output electric power based on requested electric power is distributed according to the distribution ratio β. Then, the control routine ends when control in Step S5 is performed.

On the other hand, in a case where negative determination is made in Step S4 (NO in Step S4), the distribution according to the ratio of remaining capacity α is not performed in the current state and the control routine ends. The case where negative determination is made in Step S4 indicates that a loss becomes smaller when distribution of the same electric power adjustment amount is performed in the state opposite to the current state. Thus, in a case where negative determination is made in Step S4, the ECU 40 performs the distribution of the same electric power adjustment amount in a case where a state subsequently becomes the state opposite to the current state. For example, in a case where negative determination is made in Step S4 when the current state is the power running state, the ECU 40 performs the distribution of an equal electric power adjustment amount corresponding to the ratio of remaining capacity α when the current state becomes the regeneration state. Alternatively, in a case where negative determination is made in Step S4 when the current state is the regeneration state, the ECU 40 performs distribution of an equal electric power adjustment amount corresponding to the ratio of remaining capacity α when the current state becomes the power running state.

As described above, in the embodiment, when the distribution according to a ratio of remaining capacity α is performed for electric energy adjustment, a loss generated in power running and a loss generated in regeneration are compared, and distribution according to the ratio of remaining capacity α is performed in a current state in a case where a loss in the current state is smaller. On the other hand, in a case where a loss becomes smaller when the distribution of an equal electric power adjustment amount is performed in the state opposite to the current state, the distribution is not performed in the current state and the distribution is performed when a state subsequently becomes the state opposite to the current state. Accordingly, it is possible to reduce a loss in whole traveling in consideration of both power running and regeneration.

In the above-described embodiment, a case is described where the first battery B1 is discharged and the remaining capacity A1 is reduced in power running in the example of FIG. 2 (V1>V2 and A1>A2). However, the present disclosure is not limited to this. For example, as illustrated in FIG. 9, FIG. 10, and FIG. 11, it is possible to perform the distribution in a case which is different from the above-described case.

FIG. 9 is a graph illustrating a case where a second battery B2 is discharged in power running. An example of FIG. 9 is a case where the voltage V2 of the second battery B2 is higher than the voltage V1 of the first battery B1 and a case where remaining capacity A2 of the second battery B2 is greater than remaining capacity A1 of the first battery B1. In this case (V1<V2 and A1<A2), in order to reduce the difference between the remaining capacity A1 and the remaining capacity A2, the remaining capacity A1 of the first battery B1 is increased more in regeneration or the remaining capacity A2 of the second battery B2 is reduced more in power running. A loss becomes small in the example of FIG. 9 in a case where the remaining capacity A2 of the second battery B2 having relatively high voltage is adjusted. Since the remaining capacity of the second battery B2 to be adjusted is greater than that of the first battery B1, the distribution is performed in such a manner that the remaining capacity A2 of the second battery B2 is reduced more in power running. Accordingly, in the electric energy adjustment, it is possible to reduce a loss in whole traveling in consideration of both power running and regeneration.

FIG. 10 is a graph illustrating a case where the first battery B1 is charged in regeneration. An example of FIG. 10 is a case where the voltage V1 of the first battery B1 is higher than the voltage V2 of the second battery B2 and a case where the remaining capacity A1 of the first battery B1 is smaller than the remaining capacity A2 of the second battery B2. In this case (V1>V2 and A1<A2), in order to reduce the difference between the remaining capacity A1 and the remaining capacity A2, the remaining capacity A2 of the second battery B2 is reduced more in power running or the remaining capacity A1 of the first battery B1 is increased more in regeneration. A loss becomes small in the example of FIG. 10 in a case where the remaining capacity A1 of the first battery B1 having relatively high voltage is adjusted. Since the remaining capacity of the first battery B1 to be adjusted is smaller than that of the second battery B2, the distribution is performed in such a manner that the remaining capacity A1 of the first battery B1 is increased more in regeneration. Accordingly, in the electric energy adjustment, it is possible to reduce a loss in whole traveling in consideration of both power running and regeneration.

FIG. 11 is a graph illustrating a case where the second battery B2 is charged in regeneration. An example of FIG. 11 is a case where the voltage V2 of the second battery B2 is higher than the voltage V1 of the first battery B1 and a case where the remaining capacity A2 of the second battery B2 is smaller than the remaining capacity A1 of the first battery B1. In this case (V1<V2 and A1>A2), in order to reduce the difference between the remaining capacity A1 and the remaining capacity A2, the remaining capacity A1 of the first battery B1 is reduced more in power running or the remaining capacity A2 of the second battery B2 is increased more in regeneration. A loss becomes small in the example of FIG. 11 in a case where the remaining capacity A2 of the second battery B2 having relatively high voltage is adjusted. Since the remaining capacity of the second battery B2 to be adjusted is smaller than that of the first battery B1, the electric energy is adjusted by the distribution in such a manner that the remaining capacity A2 of the second battery B2 is increased more in regeneration. Accordingly, in electric energy adjustment, it is possible to reduce a loss in whole traveling in consideration of both power running and regeneration.

Further, as a modification example of the above-described embodiment, an ECU 40 may learn a history of a change in the remaining capacity A1 of the first battery B1 and a history of a change in the remaining capacity A2 of the second battery B2 and perform distribution control on which a tendency according to the histories is reflected. The ECU 40 includes a history learning unit to learn the history of remaining capacity. For example, in a case where a frequency of power running is high and a frequency of regeneration is low, it is considered that a history of utilization in a tendency, in which the remaining capacity A1 of the first battery B1 is likely to be decreased, is acquired. In contrast, in a case where the frequency of power running is low and the frequency of regeneration is high, it is considered that a history of utilization in a tendency, in which the remaining capacity A1 of the first battery B1 is likely to be increased, is acquired. Thus, the ECU 40 in the modification example can learn a changing tendency of the remaining capacity A1 of the first battery B1 and a changing tendency of the remaining capacity A2 of the second battery B2, and can change the relationship between the distribution ratio β and the ratio of remaining capacity α according to a result of the learning. This modification example will be described with reference to FIG. 12 and FIG. 13. Note that in a description of the modification example, the descriptions about elements similar to those in the above-described embodiment are omitted and the same reference signs are used.

Figure 12:
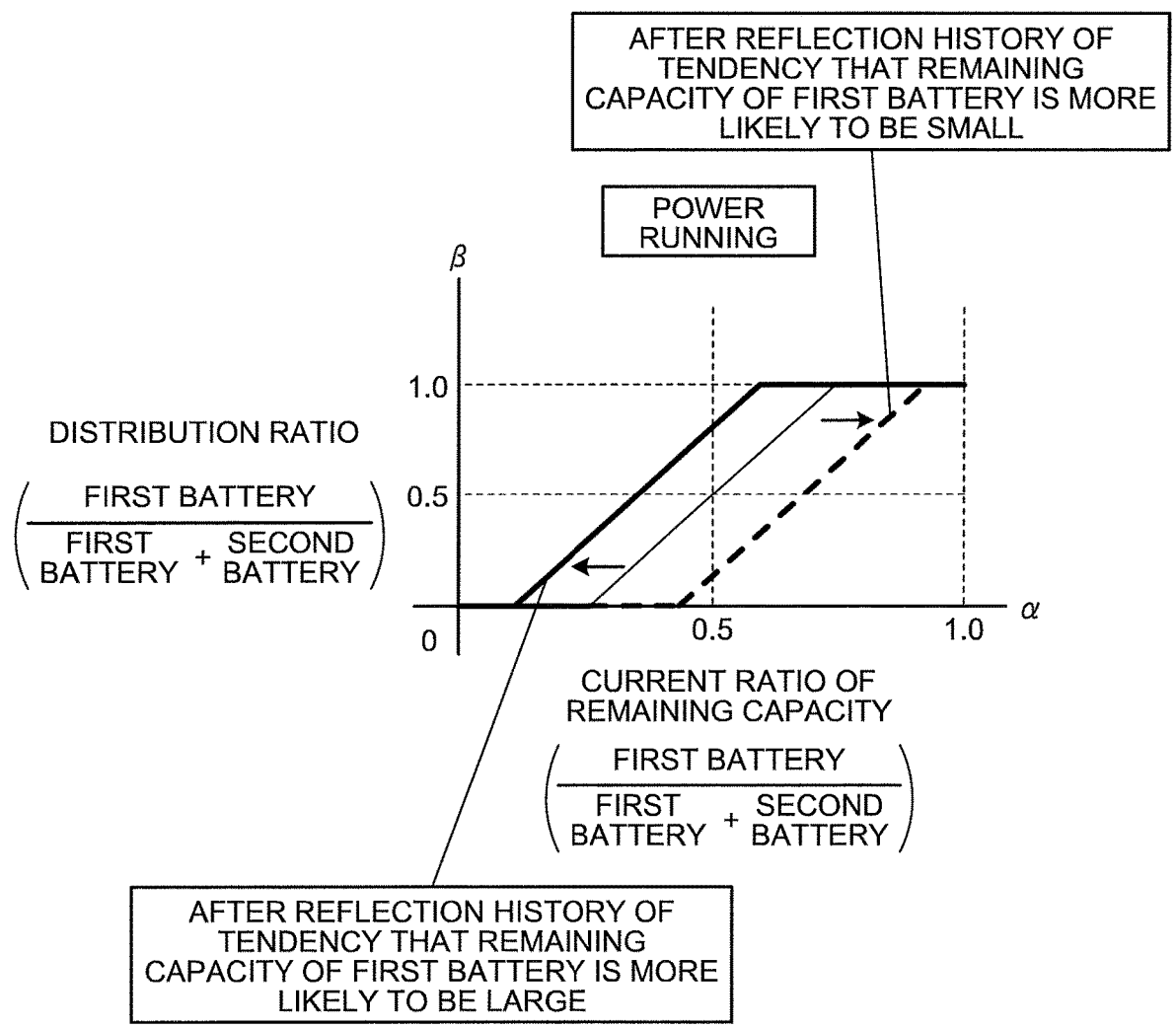
FIG. 12 is a graph illustrating a case where a history of remaining capacity is reflected on a relationship between the ratio of remaining capacity and the distribution ratio in power running.

FIG. 12 is a graph illustrating a case where the history of remaining capacity is reflected on the relationship between the ratio of remaining capacity α and the distribution ratio β in power running. In a case where the history of remaining capacity is not reflected, the relationship between the ratio of remaining capacity α and the distribution ratio β is similar to the above-described relationship of FIG. 3. The distribution ratio β becomes 0.5 when the ratio of remaining capacity α is 0.5. For example, in a case where the history indicating that there is a tendency that remaining capacity A1 of the first battery B1 becomes small is learned, the distribution ratio β is made higher on a side of the second battery B2 in such a manner that a discharged amount from the first battery B1 is decreased in power running. After this change, as indicated by a dotted line in FIG. 12, the distribution ratio β becomes a value smaller than 0.5 when the ratio of remaining capacity α is 0.5. Alternatively, in a case where the history indicating that there is a tendency that the remaining capacity A1 of the first battery B1 becomes greater is learned, the distribution ratio β is made higher on a side of the first battery B1 in such a manner that the discharged amount from the first battery B1 is increased in power running. After this change, as indicated by a thick solid line in FIG. 12, the distribution ratio β becomes a value greater than 0.5 when the ratio of remaining capacity α is 0.5. Note that although not illustrated, a relationship may be changed in such a manner that a distribution ratio β in regeneration is made higher on a side of the first battery B1 in order to increase a charged amount to the first battery B1. Similarly, a relationship may be changed in such a manner that the distribution ratio β in regeneration is made higher on a side of the second battery B2 in order to reduce a charged amount of the first battery B1.

Figure 13:
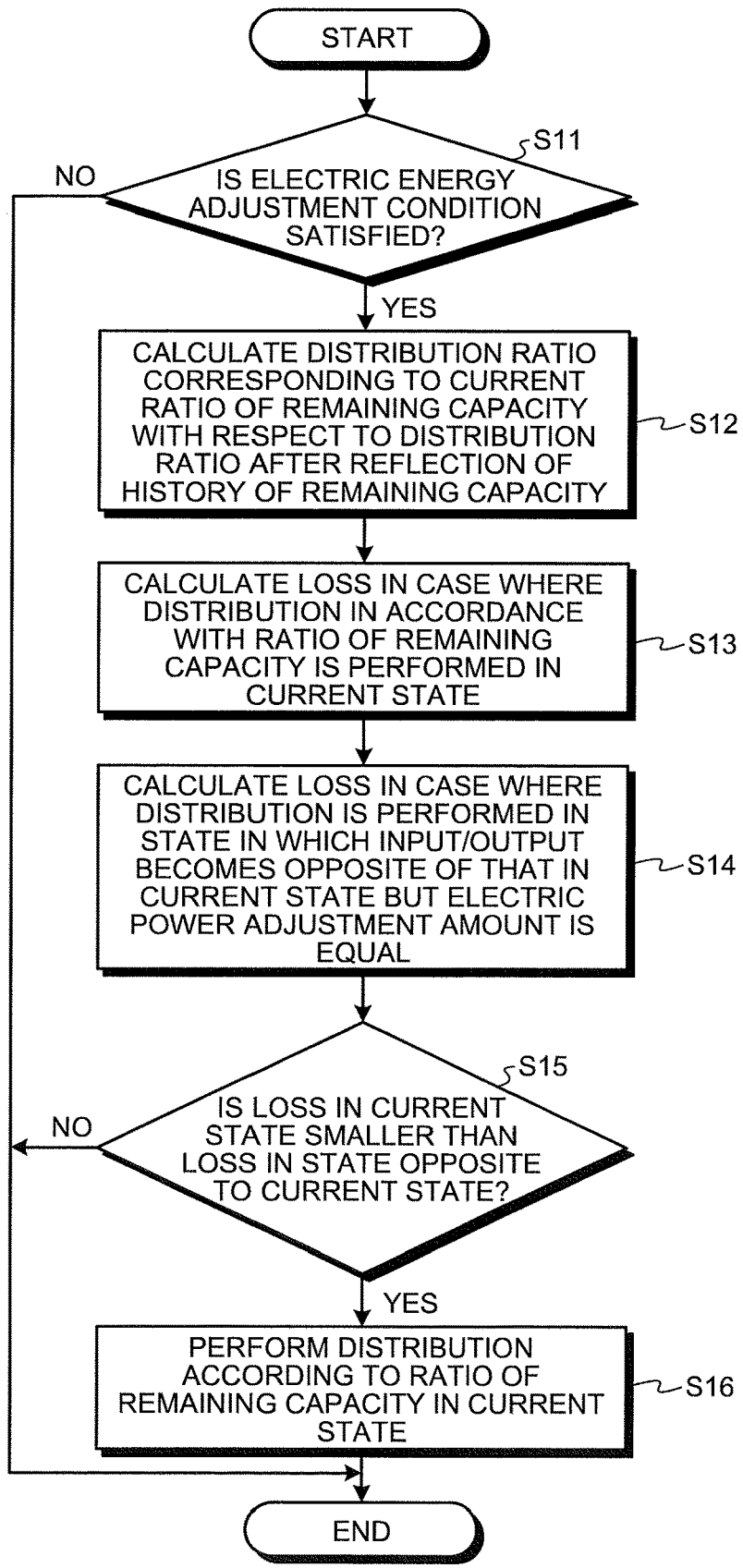
FIG. 13 is a flowchart illustrating a control flow of electric energy adjustment using the history of remaining capacity.

FIG. 13 is a flowchart illustrating a control flow of electric energy adjustment using the history of remaining capacity. The control of FIG. 13 is performed by the ECU 40.

The ECU 40 determines whether the electric energy adjustment condition is satisfied (Step S11). Step S11 is similar to Step S1 in FIG. 6. In a case where negative determination is made in Step S11 (NO in Step S11), the control routine ends.

In a case where positive determination is made in Step S11 (YES in Step S11), with respect to a distribution ratio β changed according to the history of the remaining capacity, the ECU 40 calculates a distribution ratio β corresponding to a current ratio of remaining capacity (remaining capacity ratio) α (Step S12). In Step S12, the distribution ratio β indicated by the above-described dotted line or thick solid line in FIG. 12 is calculated as the distribution ratio β for the ratio of remaining capacity α. Note that since Steps S13 to S16 in FIG. 13 is similar to Steps S2 to S5 described above in FIG. 6 except for a point that a distribution ratio β determined in Step S12 is used, descriptions thereof are omitted.

As described above, according to the modification example, the distribution ratio β is changed by utilization of the history of a change in the remaining capacity A1 of the first battery B1 and the history of a change in the remaining capacity A2 of the second battery B2. Thus, it is possible to reduce a loss in whole traveling while appropriately adjusting electric energy. That is, according to the modification example, even in a case where the frequency of power running or regeneration is high, the change into a distribution ratio β on which a changing tendency of the remaining capacity is reflected is made. Thus, it is possible to avoid a state in which the electric energy adjustment cannot be made in both of power running and regeneration. Thus, it becomes possible to appropriately manage the remaining capacity A1 of the first battery B1 and the remaining capacity A2 of the second battery B2 according to a driving tendency of a driver, a road grade, or a traffic condition.

Note that since what is desired as the vehicle Ve in which a motor generator 30 as a power source for traveling is mounted, such vehicle Ve is not limited to the above-described electric car and may be a hybrid vehicle in which an engine and a motor generator 30 are mounted. Further, a power system 100 may include a plurality of motor generators and a plurality of inverters. A circuit configuration of a power system 100 may be an electric circuit including a smoothing capacitor (not illustrated). Moreover, a circuit configuration of an electric power adjustment unit 10 is not limited to the above-described first boost converter 11 or the second boost converter 12 and what is desired is an electric circuit in which a plurality of switching elements is appropriately arranged in such a manner that the first battery B1 and the second battery B2 can perform an output independently. In addition, the first battery B1 and the second battery B2 may include secondary batteries having different maximum electric power that can be output or different maximum chargeable capacity.

According to an embodiment, in electric energy adjustment of a plurality of electric storage devices mounted in a vehicle, the distribution is performed either in power running or in regeneration whichever the loss is smaller. Thus, it is possible to reduce a loss in the entire traveling.

According to an embodiment, it is possible to reduce a loss in whole traveling since the loss in power running and the loss in regeneration are compared and the adjustment of the electric energy is performed during power running or regeneration whichever the loss is smaller.

According to an embodiment, it is possible to set a distribution ratio based on a ratio of remaining capacity and adjust electric energy by using the distribution ratio.

According to an embodiment, it is possible to change the distribution ratio so that a changing tendency of remaining capacity of each electric storage device is reflected in the changed distribution ratio. Accordingly, it becomes possible to appropriately manage the remaining capacities of the two electric storage devices in accordance with a driving tendency of a driver, a road grade, or a traffic condition.

According to an embodiment, it is possible to change the distribution ratio so that a changing tendency of remaining capacity of each electric storage device is reflected in the changed distribution ratio. Thus, it is possible to avoid a state in which the electric energy adjustment cannot be performed in both power running and regeneration even in a case where one of a frequency of power running or a frequency of regeneration is high.

According to an embodiment, a type of the first electric storage device may differ from the type of the second electric storage device. Therefore, the present disclosure can be applied to variety of vehicles.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A power-supply control device that is mounted in a vehicle including a plurality of electric storage devices and that controls charging/discharging with respect to the plurality of electric storage devices, the power-supply control device comprising:
a distribution adjustment unit configured to:
adjust electric energy in a manner that a difference between a remaining capacity of a first electric storage device and a remaining capacity of a second electric storage device becomes small when each of the electric storage devices is charged/discharged,
distribute input/output electric power to the first electric storage device and the second electric storage device on a basis of a remaining capacity ratio between the remaining capacity of the first electric storage device and the remaining capacity of the second electric storage device when adjusting the electric energy; and
a loss comparison unit configured to:
compare a loss in power running with a loss in regeneration in a case where an amount for the adjustment of the electric energy becomes the same between in power running and in regeneration, and
determine whether a loss in power running or a loss in regeneration is smaller in a current state,
wherein the distribution adjustment unit is configured to adjust the electric energy by performing the distribution in accordance with the remaining capacity ratio in the current state in a case where it is determined that loss in power running is smaller when the current state is a power running state or in a case where it is determined that loss in regeneration is smaller when the current state is a regeneration state.

2. The power-supply control device according to claim 1, wherein the distribution adjustment unit is configured not to perform the distribution in accordance with the remaining capacity ratio in the current state in a case where it is determined that the loss in regeneration is smaller when the current state is the power running state, and configured to perform the distribution in accordance with the remaining capacity ratio in a case where a state of the electric storage devices become the regeneration state, and
the distribution adjustment unit is configured not to perform the distribution in accordance with the remaining capacity ratio in the current state in a case where it is determined that the loss in power running is smaller when the current state is the regeneration state, and configured to perform the distribution in accordance with the remaining capacity ratio in a case where the state of the electric storage devices become the power running state.

3. The power-supply control device according to claim 1, further comprising:
a distribution ratio calculation unit configured to calculate a distribution ratio between input/output electric power of the first electric storage device and input/output electric power of the second electric storage device on the basis of the remaining capacity ratio,
wherein the loss comparison unit is configured to calculate, on a basis of the distribution ratio, the loss in power running and the loss in regeneration in a case where the amount for the adjustment of the electric energy becomes the same between in power running and in regeneration.

4. The power-supply control device according to claim 3, further comprising:
a history learning unit configured to learn a history of a change in the remaining capacity of the first electric storage device and a history of a change in the remaining capacity of the second electric storage device,
wherein the distribution ratio calculation unit is configured to change a relationship between the distribution ratio and the remaining capacity ratio by reflecting a tendency of the change in the remaining capacities in the histories.

5. The power-supply control device according to claim 4, wherein the distribution ratio calculation unit is configured to:
change the relationship between the distribution ratio and the remaining capacity ratio in a manner that a discharged amount of the first electric storage device becomes small in power running in a case where the history is a history indicating a tendency that the remaining capacity of the first electric storage device is likely to be small, or
change the relationship between the distribution ratio and the remaining capacity ratio in a manner that a discharged amount of the first electric storage device becomes large in power running in a case where the history is a history indicating a tendency that the remaining capacity of the first electric storage device is likely to be large.

6. The power-supply control device according to claim 1, wherein the first electric storage device and the second electric storage device are secondary batteries, and types of the secondary batteries are difference from each other.

* * * * *